United States Patent [19]

Young

[11] Patent Number: 4,804,635
[45] Date of Patent: Feb. 14, 1989

[54] METHOD OF MANUFACTURE OF GALLUIM ARSENIDE FIELD EFFECT TRANSISTORS

[75] Inventor: John M. Young, Essex, England

[73] Assignee: ITT Gallium Arsenide Technology Center, A Division of ITT Corporation, Roanoke, Va.

[21] Appl. No.: 710,058

[22] Filed: Mar. 11, 1985

[30] Foreign Application Priority Data

Mar. 15, 1984 [GB] United Kingdom ............... 8406722

[51] Int. Cl.[4] ............... H01L 21/306; H01L 21/24; H01L 21/265
[52] U.S. Cl. .................................. 437/41; 437/912
[58] Field of Search ................... 29/571, 576 B, 591; 148/188; 437/41, 912

[56] References Cited

U.S. PATENT DOCUMENTS

| | | | |
|---|---|---|---|
| 3,617,824 | 11/1971 | Shinoda et al. | 148/187 X |
| 4,109,372 | 8/1978 | Geffken | 29/578 X |
| 4,180,596 | 12/1979 | Crowder et al. | 29/591 X |
| 4,425,700 | 1/1984 | Sasaki et al. | 29/571 |
| 4,458,410 | 7/1984 | Sugaki et al. | 29/578 X |
| 4,546,540 | 10/1985 | Ueyanagi et al. | 29/571 X |

Primary Examiner—Brian E. Hearn
Attorney, Agent, or Firm—Robert A. Walsh; Thomas N. Twomey; Mary C. Werner

[57] ABSTRACT

A self-aligned gate structure for a compound semiconductor MESFET is formed from a lower silicon layer and an upper metal, e.g. nickel, region. The nickel region forms an etch mask for the silicon and subsequently an implantation mask for the drain and source regions. Etching of the silicon provides an undercut whereby the gate separation from the drain and source is defined. Heating the structure to anneal the implant diffuses the metal into the silicon to form a compound silicide gate structure.

1 Claim, 2 Drawing Sheets

METHOD OF MANUFACTURE OF GALLUIM ARSENIDE FIELD EFFECT TRANSISTORS

BACKGROUND OF THE INVENTION:

This invention relates to field effect transistors and in particular to such transistors fabricated in a III-V semiconductor, e.g. gallium arsenide.

With the increasing need to raise the device cut-off frequency, silicon is being replaced by compound semiconductors in the fabrication of high speed integrated circuits. The most commonly employed of these new materials is gallium arsenide. Conventionally field effect transistors (MESFET's) are fabricated in this material be selectively implanting an n-type channel region into a semi-intrinsic GaAs substrate, implanting heavily doped n+ type source and drain regions, and forming ohmic contacts to the source and drain. The gate metal, typically chromium/gold, is then defined between the source and drain regions. Further layers of gold may then be deposited to form interconnects, e.g., in the formation of an integrated circuit.

Of the photolithographic steps used in this process the most critical is that which defines the transistor gate. For high performance operation the gate metal strip must not only be narrow, typically 1 micron or less, but must also be separated from the source by a similar submicron dimension. This spacing requirement is necessary to minimize the parasitic series resistance between the source and channel of the transistor. It will be appreciated that the use of a photolithographic process with such critical dimensional tolerances results in a low yeild and/or excessive and variable series resistance.

In an attempt to overcome this problem a number of processes have been developed in which the source and drain regions are self aligned to the gate. In a typical process of this type a gate material that is stable at the temperature required for annealing the source/drain implant is employed. The gate is defined prior to the implantation step and the subsequent annealing. In the finished device there is then no gap between the low resistivity source region and the controlled channel. In practice this 'zero gap' technique introduces further difficulties because the resulting diode between the gate and source has no blocking characteristic.

SUMMARY OF THE INVENTION

One object of the present invention is to minimize or to overcome this disadvantage.

According to one aspect of the invention there is provided a process for fabricating a field effect transistor in a compound semiconductor, the process including providing a semiconductor substrate having a layer of silicon deposited on one major surface thereof, selectively depositing a metal on said surface to define a transistor gate area, implanting drain and source regions using the metal as a mask to define the gate/drain and gate/source spacing, removing the exposed silicon and undercutting the metal, and heating the assembly whereby the implanted regions are annealed and activated and whereby the metal diffused partially or completely into the remaining silicon to form a metal silicide gate.

In a preferred embodiment the relative thickness of the silicon and metal films are such that stoichiometry is achieved when all the metal has been consumed. Typically the metal is nickel.

BRIEF DESCRIPTION OF THE DRAWING

An embodiment of the invention will now be described with reference to the accompanying drawings in which.

DETAILED DESCRIPTION

Figure 1:
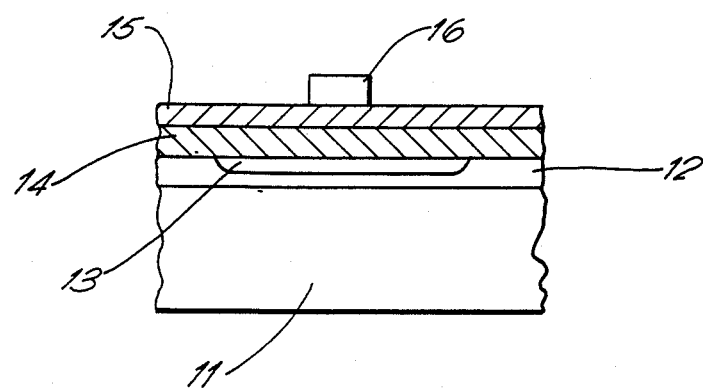
FIGS. 1 to 5 illustrate successive steps in the fabrication of a field effect transistor, e.g. in an integrated circuit.

Referring to the drawings, a semiconductor, e.g. gallium arsenide, wafer 11 (FIG. 1) is provided with a surface layer 12 e.g. by epitaxial growth. This surface layer 12 is of high resistivity, i.e. semi-insulating, material having very few conduction electrons (typically about $10^9$ cm $^{-3}$). Layer 12 is of the same material as the substrate, i.e., gallium arsenide. Into this high resistivity layer 12 a moderately doped n-type channel region 13 is selectively implanted through a first mask (not shown). This channel material typically has about $10^{17}$ cm$^{-3}$ electrons in its conduction band. Alternatively, a sheet channel implant may be performed and the individual device region then isolated by proton implantation. In an alternative embodiment which is not shown a semi-insulating substrate may be employed and the surface layer 12 may be dispensed with.

The semiconductor surface is next provided with a polycrystalline layer 14 of silicon. This may be effected by the standard deposition techniques well established in the art.

Figure 2:
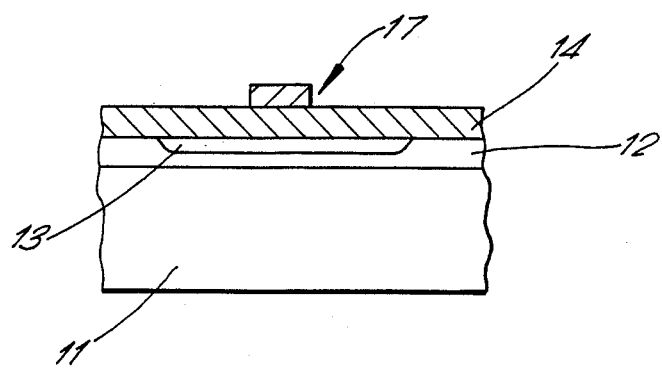

A further layer 15 of a metal, e.g. nickel, capable of forming a silicide is next deposited followed by a photoresist mask 16. The assembly is etched through the mask 16 (FIG. 2) to remove the exposed nickel 14 whereby the gate region 17 of the transistors is defined in register with the channel region 13.

Figure 3:
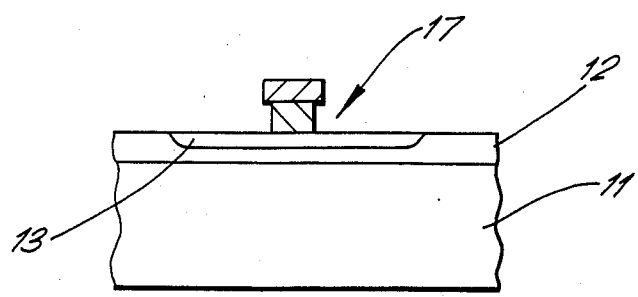

The assembly is next exposed to an etchant, e.g. a fluorocarbon/oxygen plasma to remove the exposed silicon 14 (FIG. 3) and to undercut the edges of the gate region 17. This provides a controlled separation between the source and drain regions and the gate. The gate is typically 1 micron in width and is provided with an undercut of about 0.25 microns. The dimensions of the gate and the undercut of the gate are not critical: they will depend on the particular circuit construction in which the device is employed.

Figure 4:
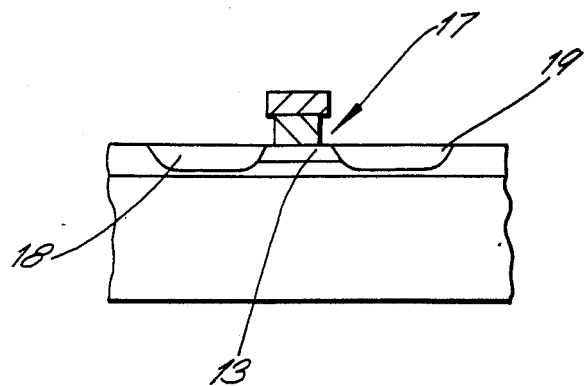

A second mask (not shown) is applied and drain (18) and source (19) regions (FIG. 4) are ion implanted. The undercut metal gate acts as a mask to define the edges of the source and drain regions and thus provides a predetermined spacing from the gate, this spacing being determined by the degree of undercut. This technique provides automatic alignment of the drain and source regions relative to the gate. Typically the drain and source regions are doped to an impurity concentration of $10^{20}$ to $10^{21}$ cm$^{-3}$. A standard n-type dopant, silicon, may be used to form the channel, source and drain regions.

Figure 5:
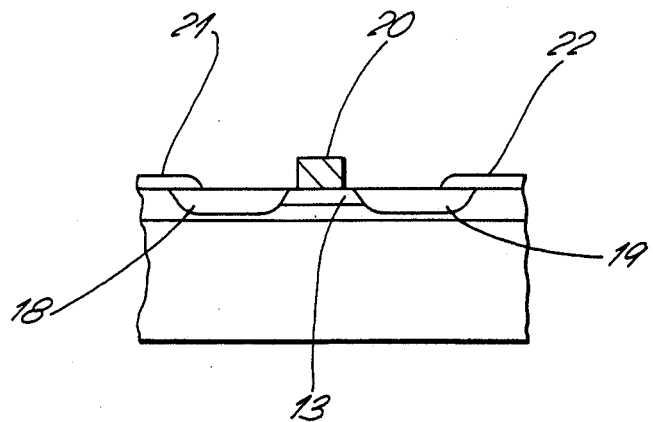

The assembly is next heated to anneal the implant and simultaneously to diffuse the metal into the silicon to form a metal silicide gate electrode 20 (FIG. 5). A further mask (not shown) is then applied whereby a contact metal or alloy is deposited to define the drain and source electrodes 21, 22 and the gate contact (not shown). The structure may then be separated from the wafer and packaged.

In a preferred embodiment the relative thicknesses of the silicon and metal layers are chosen such that, after the diffusion step is completed, a stoichiometric silicide is formed and all the free metal is consumed. The silicon layer 14 and the metal layers are typically between 0.25 and 1 micron in the thickness and are of similar thicknesses.

In other applications it may be preferred to provide excess metal such that after silicide formation a metallic layer is left on the gate. In other applications an excess of silicon can be employed as this may improve the barrier height.

It will be appreciated that, although the foregoing description relates to the fabrication of a single transistor, the process can be used for the simultaneous fabrication of a plurality of transistors, e.g. in the manufacture of integrated circuits. The technique can also be employed for the fabrication of devices in compound semiconductors other than gallium arsenide.

What is claimed is:

1. A process for fabricating a field effect transistor including:

providing a semiconductor substrate having a layer of silicon deposited on one major surface thereof;

selectively depositing a metal on said surface to define a transistor gate area;

implanting drain and source regions using the metal as a mask to define the gate/drain and gate/source spacing;

removing the exposed silicon and undercutting the metal; and heating the assembly whereby the implanted regions are annealed and activated and whereby simultaneously the metal diffuses into the remaining silicon to form a metal silicide gate.

* * * * *